United States Patent [19]

Bazes

[11] Patent Number: 4,496,861
[45] Date of Patent: Jan. 29, 1985

[54] INTEGRATED CIRCUIT SYNCHRONOUS DELAY LINE

[75] Inventor: Mel Bazes, Haifa, Israel

[73] Assignee: Intel Corporation, Santa Clara, Calif.

[21] Appl. No.: 447,231

[22] Filed: Dec. 6, 1982

[51] Int. Cl.³ .................... H03K 5/13; H03K 5/159
[52] U.S. Cl. .................... 307/602; 307/603; 307/605; 307/471
[58] Field of Search ............ 307/602, 603, 606, 471; 377/76, 594–597; 328/130

[56] References Cited

U.S. PATENT DOCUMENTS

| 3,599,011 | 8/1971 | Zwolle | 307/606 |
| 3,634,772 | 1/1972 | Katz | 377/76 |
| 4,023,110 | 5/1977 | Oliver | 307/602 |

Primary Examiner—Stanley D. Miller
Assistant Examiner—B. P. Davis
Attorney, Agent, or Firm—Blakely, Sokoloff, Taylor & Zafman

[57] ABSTRACT

A synchronized delay line is described which is tapped to provide a plurality of timing signals. The delay line is insensitive to voltage changes, temperature changes and wafer processing variations. It is ideally suited for providing on-chip timing signals derived from a reference clock for MOS integrated circuits.

14 Claims, 5 Drawing Figures

SAMPLE-AND-HOLD AND FILTER

DELAY LINE EQ FEEDBACK-CONTROL NETWORK

INTEGRATED CIRCUIT SYNCHRONOUS DELAY LINE

BACKGROUND OF THE INVENTION

1. Field of the Invention

The invention relates to the field of generation of clock signals with a delay line, particularly for metal-oxide-semiconductor (MOS) circuits.

2. Prior Art

In integrated circuit memories, processors, as well as other circuits, it is necessary to have clock or timing signals. For instance, in dynamic, random-access memories, many clock signals are required for each memory cycle to latch addresses, decode the addresses, access the array, precharge nodes, control refreshing, etc. Obviously, by generating these signals "on-chip" the need for precision clock generators, external to the integrated circuit is eliminated.

Generally in the prior art, an externally applied pulse is delayed on-chip to provide timing signals. This delay is provided using the charge-discharge characteristics of a resistor-capacitor network or of an MOS transistor-capacitor network in the case of MOS circuits. The length of the delay is controlled in these cases by the amount of resistance, capacitance or by the characteristics of an MOS transistor.

This prior art technique for generating on-chip timing signals does not result in accurate signals, in terms of time. The large variations, for example, in MOS circuit characteristics due to typical wafer processing, supply voltage variations and operating temperature cause substantial variations in timing delays. In a typical MOS circuit, variations from 2:1 to as high as 8:1 are encountered.

As will be seen, the present invention provides a circuit for generating clock signals which have a very high timing accuracy and insensitivity to variations from wafer processing, supply voltage and temperature. In addition, the timing accuracy with the present invention has the unusual characteristic of improving with increased value of the desired delay.

SUMMARY OF THE INVENTION

An integrated circuit delay line apparatus for generating an arbitrary number of delayed signals synchronized with and delayed from a reference signal is described. A plurality of delay means, each for providing a controllable delay are employed. Each of these means are coupled to receive a control signal which controls the duration of the delays. The first delay means is coupled to receive the reference signal and each of the remaining delay means are coupled to sequentially receive the reference signal from the first delay means. A control signal generation means generates the control signal. The first delayed signals are tapped from the delay means.

In the presently preferred embodiment, each delay means includes a pair of cross-coupled gates with a pair of capacitors and a pair of coupling transistors. The control signal is generated with a sample-and-hold means and lowpass filter which are coupled to receive the fully delayed reference signals from the last delay means. The sampling occurs in synchronism with the reference signal. The single control signal controls the flow of current to all the capacitors associated with each of the delay means, thereby controlling the delay. A closed loop is formed with the control signals which causes the sum of all the delays to equal the duration between each transition of the symmetrical reference signal.

DETAILED DESCRIPTION OF THE INVENTION

A precision synchronous delay line (SDL) for generating clock transitions (edges) at selected intervals is described. In the following description numerous specific details are set forth, such as specific circuits, in order to provide a thorough understanding of the present invention. It will be obvious, however, to one skilled in the art that the present invention may be practiced without these specific details. In other instances, well-known circuits such as a divide-by-two circuit are not described in detail in order not to unnecessarily obscure the present invention.

As will be seen with the present invention, the delay intervals may be expressed as fractions of the period of a reference clock signal. The sum of all delay intervals equals the reference clock intervals. Thus, the delay intervals are directly proportional to the reference clock period and may be varied by varying the reference clock period. The applications for the SDL as described in the prior art section include precision delays for MOS circuits, variable-duty-cycle clock generators, frequency multipliers, etc.

In the presently preferred embodiment the invention is realized as part of a metal-oxide-semiconductor (MOS) integrated circuit. The invention may be fabricated employing any one of many well-known MOS processes or complementary MOS processes.

Figure 1:
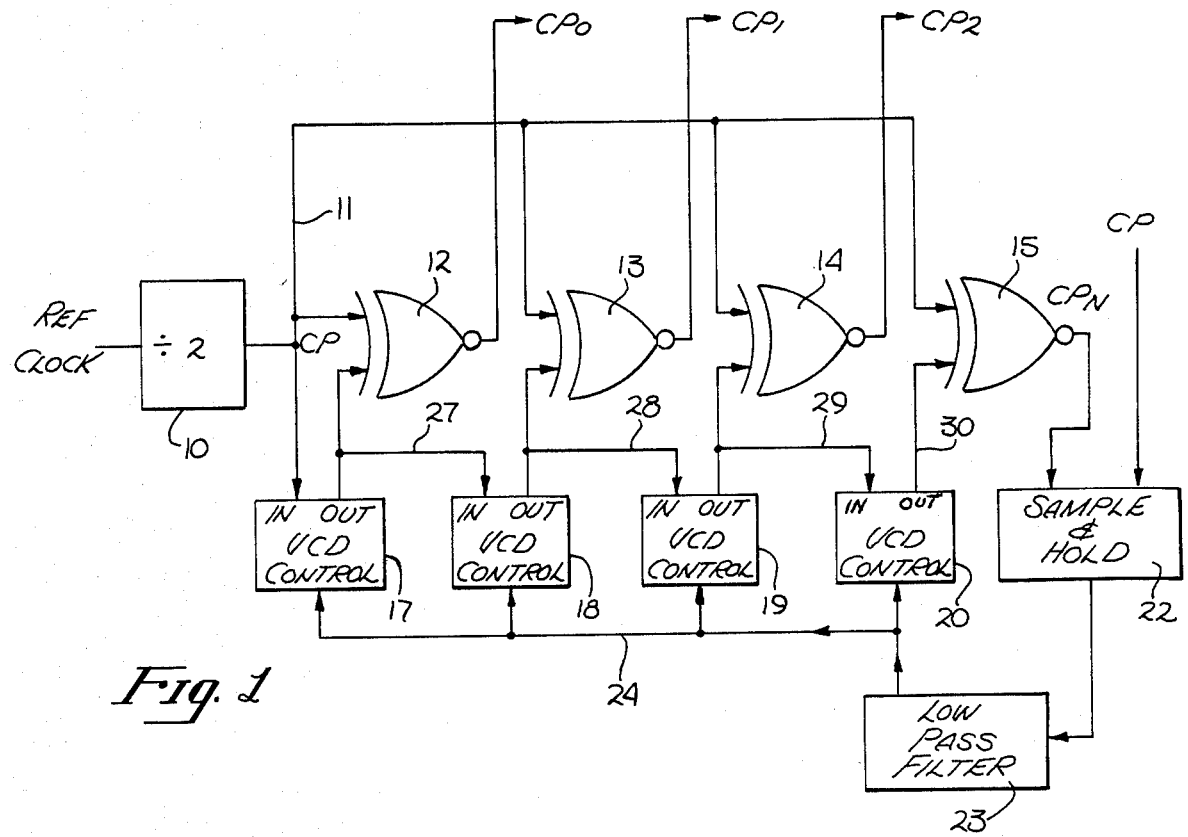
FIG. 1 is a block diagram which illustrates the concept of the present invention.

The delay line, in its presently preferred embodiment, requires a symmetrical reference clock signal. In many cases, the externally applied clock signal will not be symmetrical. A symmetrical waveform can be produced by using a divide-by-two circuit such as circuit 10 shown in FIG. 1. The externally generated reference clock is applied to the divide-by-two circuit 10 and produces the reference clock signal CP shown in FIG. 2. This signal has equal durations in its high state and low state as shown.

The output of the circuit 10 is coupled by a common line 11 to one input terminal of each exclusive NOR gates 12, 13, 14, and 15. The CP signal is also coupled to a first voltage controlled delay circuit 17. The delayed CP signal from circuit 17 is coupled to the other input terminal of the gate 12 and also by line 27 to a second voltage controlled delay circuit 18. The output of the circuit 18 is coupled to the other input of the gate 13, and also (via line 28) to a third voltage controlled delay circuit 19. Similarly, the output of circuit 19 is coupled to gate 14 and to the last voltage controlled delay circuit 20 via line 29. The output of the circuit 20 is coupled to the gate 15. Although four stages, each comprising an exclusive NOR gate and a voltage controlled delay circuit, are shown, any number of stages over two may be used.

Each of the voltage controlled delay circuits provides a time delay which is controlled by a single control signal coupled to the circuits 17 through 20 on line 24. This control signal is generated from the $CP_N$ signal, which is coupled to the sample-and-hold means 22 from the output of the gate 15. The $CP_N$ signal is sampled under control of the CP signal and, after being filtered by lowpass filter 23, provides the control signal on line 24.

Figure 2:
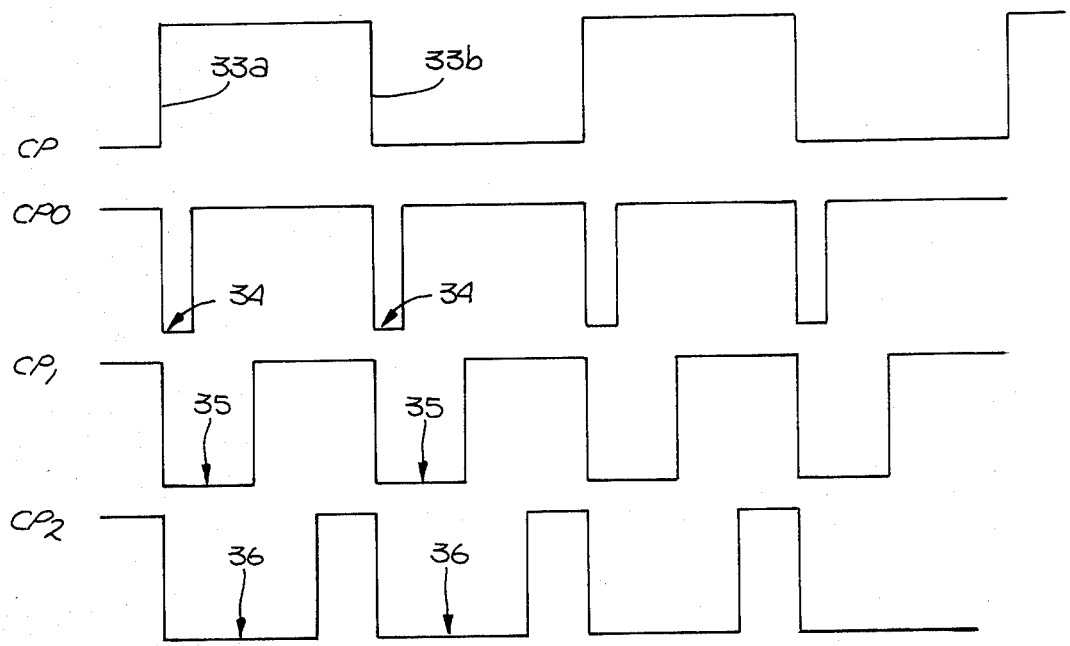
FIG. 2 is a plurality of waveforms used to describe the operation of the present invention.

First assume that the CP signal is in its low state, and there is no output from the voltage controlled delay circuits 17 through 20. For this condition, the timing signals $CP_0$, $CP_1$, $CP_2$, and $CP_N$ are all high as shown for $CP_0$, $CP_1$, and $CP_2$ in FIG. 2. When the CP signal rises, as shown by the edge 33a of FIG. 2, a transition occurs at the output of gates 12 through 15 since the CP signal is coupled to one input terminal of each of these gates. After the CP signal is delayed through circuit 17, it reaches the gate 12 causing the output of this gate to rise. The delay 34 of FIG. 2 represents the delay through circuit 17 (ignoring other delays such as the delay inherent in gate 12). After signal 27 is delayed by circuit 18, it causes the output of gate 13 to rise in potential as shown in FIG. 2. The cumulative delay of circuits 17 and 18 is represented by the duration 35 for the $CP_1$ signal. Similarly, after signal 28 has been delayed through circuit 19, it causes the signal at the output of gate 14 to rise in potential as shown by the waveform $CP_2$. The total delay through the circuits 17, 18 and 19 is shown as duration 36 in FIG. 2. Similarly, although not shown, the output of gate 15 rises in potential after the delay caused by circuit 20 is sensed on line 30 by gate 15.

When the CP signal drops in potential, as shown by edge 33b, the outputs of the gates once again drop in potential. Assuming the circuits 17 through 20 provide delays for each transition of the CP signal, the delays through these circuits again occur and the timing signals $CP_0$, $CP_1$, and $CP_2$ are again generated. The $CP_N$ signal (at the output of gate 15) occurs at each transition of the CP signal. The signal is sampled by the sample-and-hold means 22 at each transition of the CP signal. Each sample can have one of three values; it can be low, high or intermediate. If the sum of the delays through circuits 17, 18, 19 and 20 is less than the time between transitions of the CP signal, then $CP_N$ will be high when sampled. This higher potential, after passing through the lowpass filter 23 is coupled to all the delay circuits along line 24 causing the delays to be lengthened. If the sum of the delays through delay circuits 17 through 20 is greater than the time between the transitions of the CP signal, then $CP_N$ will be low when sampled. For this condition, the control signal drops in potential and the delays through circuits 17 through 20 are shortened. If the $CP_N$ signal is in a transition when the CP signals are in a transition, the delays through circuits 17 through 20 are equal to the time between transitions of the CP signal, this being the desired control point.

The output of the sample-and-hold means 22 is filtered by the filter 23 to remove the high frequency components introduced in the sampling process. This filter is also used to limit the open-loop gain-bandwith product to ensure stable closed-loop operation.

Thus, the total delays through circuits 17 through 20 are controlled to equal the transitions between the CP signal and therefore the $CP_0$, $CP_1$, and $CP_2$ signals are synchronized with and delayed from $C_P$. In practice, and as will be seen in FIG. 3, the capacitances which provide the delays and the transistors which charge and discharge the capacitances in the delay circuits are fabricated to provide the desired delays for the timing signals. If the periods of the CP signal increase, the delays of the other timing signals increase proportionately. The delays are directly proportional to the reference clock period and can be accurately controlled since the ratio of capacitances which provide the delays can be accurately fabricated.

Figure 3:
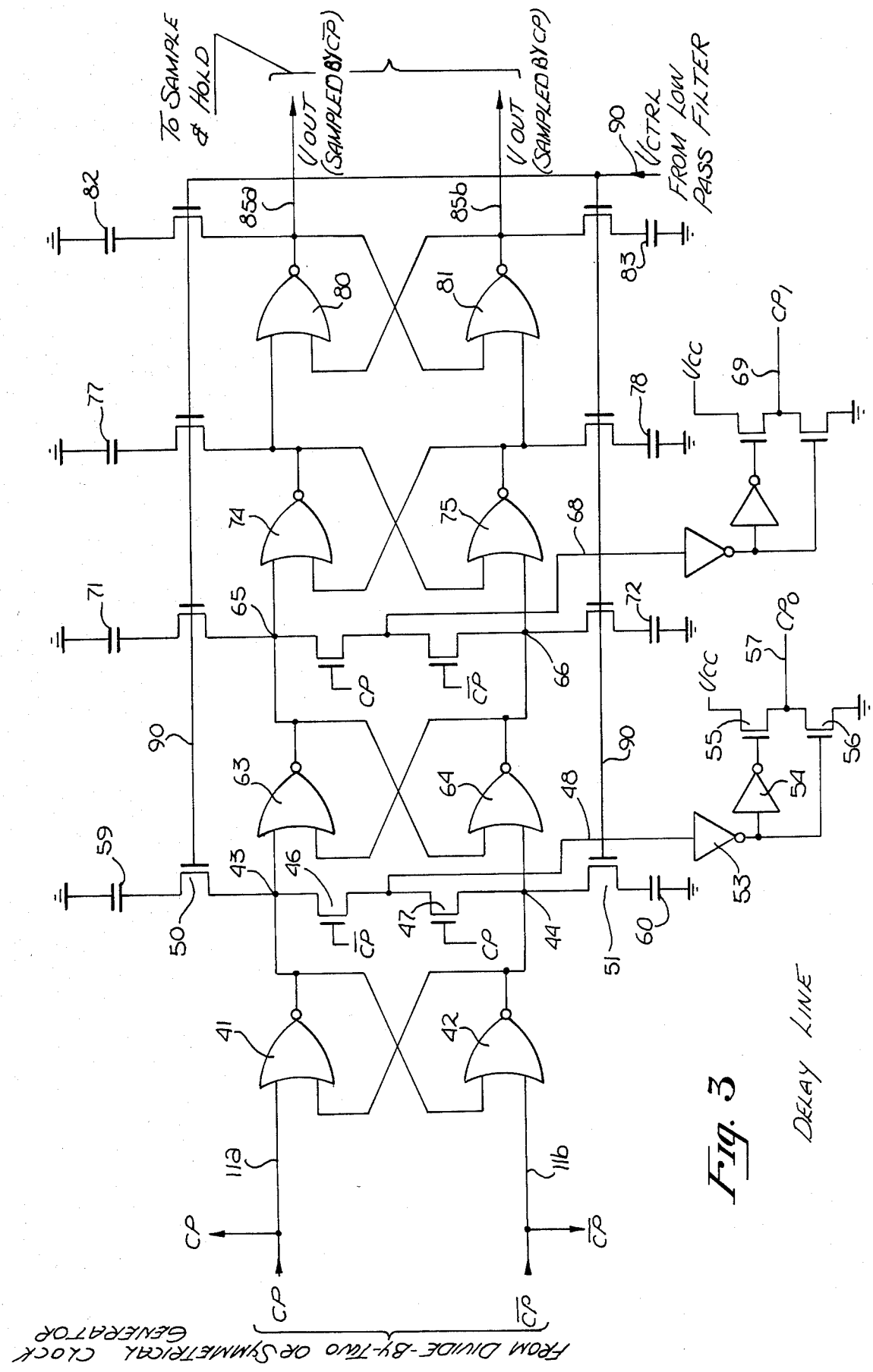
FIG. 3 is an electrical schematic of the delay line used in the presently preferred embodiment of the invention.

Referring now to FIG. 3 and the presently preferred embodiment of the delay line, the delay line is again driven by a symmetrical waveform, the reference signal CP. This signal and its complement are coupled to lines 11a and 11b, respectively. An ordinary divide-by-two circuit may be used as described in conjunction with FIG. 1 to provide the wavefrom CP. If the system uses two clock phases, an appropriate divide-by-two circuit may be selected. It is preferred that CP and CP/ be generated with the shortest possible delay from the edges of the externally applied reference signal.

The delay line of FIG. 3 comprises four stages, although any number of stages over two may be used. Each stage includes a pair of cross-coupled NOR gates. The delay line is tapped at two points to provide two output timing signals, $CP_0$ and $CP_1$, although taps may be made at any or all points in the delay line.

The cross-coupled NOR gates 41 and 42 receive the signals 11a and 11b, respectively, on one of their input terminals. The other input terminal of each of the gates is cross-coupled to the output of the other gate. The output of each gate is coupled to a capacitor through a transistor which receives the control signal. Specifically, the output of gate 41 is coupled to a capacitor 59 through transistor 50. Similarly, the output of the NOR gate 42 is coupled to capacitor 60 through transistor 51. The gates of transistors 50 and 51 are coupled to a common line 90.

Each of the stages of the delay line is symmetrical, that is, the capacitance of capacitor 59 equals the capacitance of capacitor 60 and transistors 50 and 51 are of the same size. Also, the NOR gates 40 and 41 are identical. The delay associated with the first stage is a function of the capacitance of the capacitors 59 and 60 and the rate at which current flows through the transistors 50 and 51 (again ignoring other propagation delays). The current flow through these transistors is controlled by the signal on line 90 which signal is received from a lowpass filter corresponding to filter 23 of FIG. 1.

Assume for sake of discussion that CP is high and CP/ is low. The output of gate 41 will be low and the output of gate 42, high. Node 44 begins to charge; the rate at which it charges is a function of the capacitance 60 and the conductance of transistor 51. Since CP is high, transistor 47 conducts, coupling line 48 to node 44. This tap on the line is coupled through inverters 53 and 54 to the gate of a transistor 55, and through inverter 53 to the gate of transistor 56. An output signal is provided on line 57. The inverters 53 and 54 "square up" the waveform from the tap and assure a square wave on line 57. As was the case in FIG. 1, when the CP signal goes high, line 48 is essentially coupled to ground through transistors 47 and 51. This causes transistor 56 to conduct and couples line 57 to ground. As soon as the potential on node 44 rises, transistor 56 ceases to conduct and transistor 55 conducts, pulling line 57 to $V_{CC}$. The time required for this to occur corresponds to the interval 34 shown in FIG. 2.

When the CP/ signal goes high, node 43 is first coupled to ground through transistor 50 and then is charged in the same manner as node 44. The potential on node 43 is coupled through transistor 46 to the input of inverter 53 since the CP/ signal is high. Note that the capacitors 59 and 60 are discharged during each cycle; for instance, when the output of gate 42 is low, node 44 is brought to ground potential, discharging capacitor 60.

The next stage of the delay line which comprises the cross-coupled NOR gates 63 and 64 operates in a similar manner to the first stage. Node 65 is coupled to line 68, this time when the CP signal is high; and similarly, node 66 is coupled to line 68 when the CP/ signal is high. An output timing signal, $CP_1$, is provided on line 69. The delay through this stage is a function of the capacitance of capacitors 71 and 72 and the potential on line 90. The capacitors 71 and 72 have equal capacitance; however, the capacitance can be different than that of capacitors 59 and 60, causing a different delay through this stage.

The third stage of the delay line comprises the cross-coupled NOR gates 74 and 75, and the delay through this stage is a function of the capacitance of capacitors 77 and 78. The last stage of the delay line comprises the cross-coupled NOR gates 80 and 81 and the delay through this stage is a function of the capacitance of capacitors 82 and 83. The output from the delay lines, lines 85a and 85b, are coupled to a sample-and-hold means; this output corresponds to $CP_N$ of FIG. 1.

Figure 4:
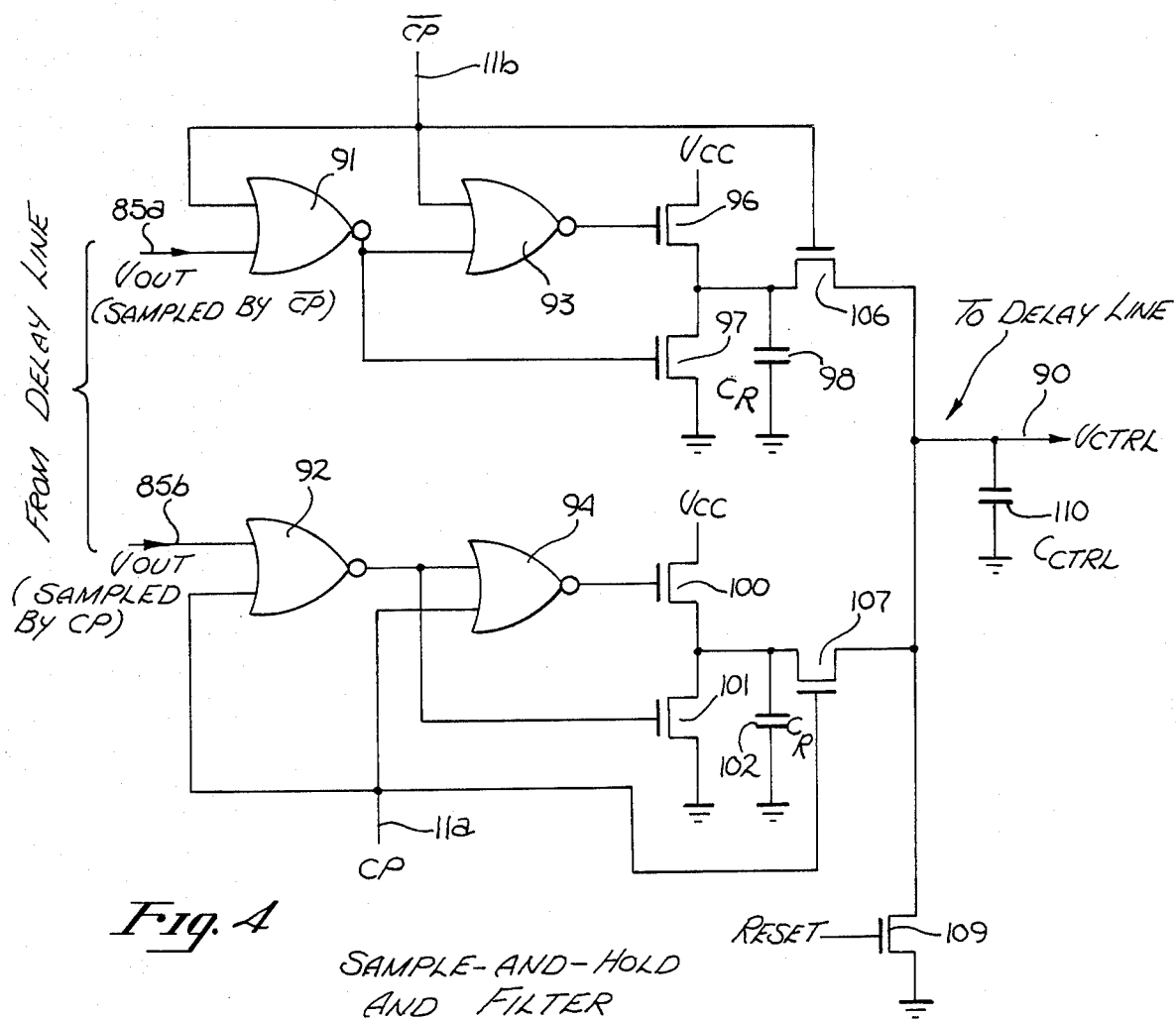
FIG. 4 is an electrical schematic of the sample-and-hold means and filter used in the presently preferred embodiment of the invention.

In FIG. 4, the sample-and-hold means and lowpass filter, as presently preferred, are combined into a single switched-capacitor network. Line 85a of FIG. 3 is coupled to one input terminal of NOR gate 91. Similarly, line 85b is coupled to one input terminal of NOR gate 92. The other input terminal of gate 91 and one input terminal of gate 93 receive the CP/ signal. In a complementary fashion, the other input terminal of gate 92 and one input terminal of the NOR gate 94 receive the CP signal. The output of gate 91, in addition to being coupled to the other input terminal of gate 93, is coupled to the gate of transistor 97. The output of gate 93 is coupled to the gate of transistor 96. Similarly, the output of gate 92 is coupled to the other input terminal of gate 94 and to the gate of transistor 101. The output of gate 94 is coupled to the gate of transistor 100. The common junction between transistors 96 and 97 is coupled to a capacitor 98 (having a capacitance $C_R$). This capacitor is coupled through transistor 106 to capacitor 110 ($C_{CTRL}$). In a symmetrical manner, the common junction between transistors 100 and 101 is coupled to a capacitor 102 (having a capacitance of $C_R$) and this capacitor is coupled through transistor 107 to capacitor 110. The control signal is obtained on line 90, and this line may be discharged (reset through transistor 109).

For large values of the ratio $C_{CTRL}/C_R$, the switched-capacitor network of FIG. 4 has a time constant of $T_P(C_{CTRL}/C_R)$, where $T_P$ is the period of the reference signal (or the high time of CP). $C_{CTRL}$ also includes the gate capacitances of the gates of transistors 50 and 51 and the similarly coupled gates along line 90 of FIG. 3. Note that this time constant is only a function of capacitor ratios and the clock period, and so the time constant can be controlled with high precision.

Figure 5:
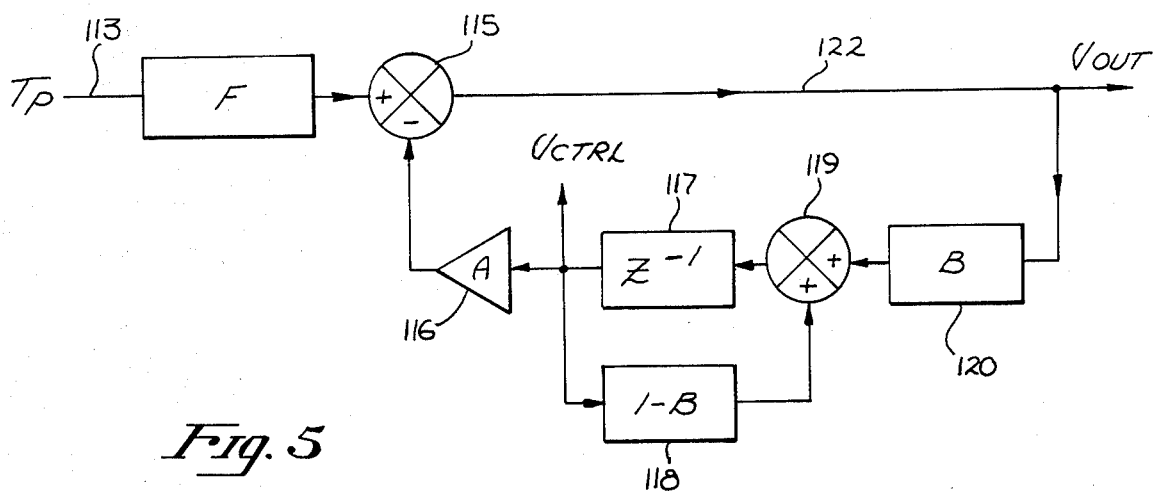
FIG. 5 is a diagram of an equivalent circuit used to describe the feedback-control used in the present invention.

Examining the closed loop operation of the circuits of FIGS. 3 and 4, the equivalent feedback-control network is shown in FIG. 5. $T_p$, the reference clock period, is treated as an analog input in FIG. 5 to an element "F" which produces an output voltage proportional to $T_p$. The output of the summing node 115 is coupled to element 120 via line 122. B is defined as $C_R/(C_{CTRL}+C_R)$ and 1 minus B is defined as $C_{CTRL}/(C_{CTRL}+C_R)$. The gain of amplifier 116 "A" is defined as $dV_{OUT}/dV_{CTRL}$. The output of element 120 is coupled to the summing node 119 as is the output of element 118. Element 117 is the sampling function, with its notation borrowed from Z-transform analysis.

The following analysis assumes that all s-plane poles and zeroes in the component elements of the network have no effect on the loop. This approximation is excellent, since, in general, $T_p \gg \Sigma\ 1/S_i$, where $S_i$ are the dominant poles in the network. The above inquality simply states that, since the sampling interval is long when compared to the gate delays in the loop, all transients die out by the end of the interval; thus the poles and zeros causing the transients have not effect on amplitude or phase at the sampling point.

The equation for $V_{OUT}$ as a function of Tp is derived from FIG. 5 as:

$$V_{OUT}(n+1) = FT_p(n+1) - (1-B)FT_p(n) + [1 - B(A+1)]V_{OUT}(n), \qquad \text{(Eq. 1)}$$

where n is the nth sampling point. Equation 1 may be rewritten concisely using Z-transform notation as:

$$\frac{V_{OUT}}{T_p} = \frac{F[1 - (1-B)Z^{-1}]}{1 + [B(A+1) - 1]Z^{-1}}. \qquad \text{(Eq. 2)}$$

Equation 1 may be evaluated recursively as $$V_{OUT}(n+1) = F\sum_{i=0}^{n}[1 - B(A+1)]^{n-i}[T_p(i+1) - (1-B)T_p(i)] + [1 - B(A+1)]^{n+1}V_{OUT}(0). \qquad \text{(Eq. 3)}$$

In the case that Tp is a step function, such that $T_p(i) = T_p$ for $i \geq 0$, Equation 3 reduces to $$V_{OUT}(n+1) = FT_p/(A+1) + [1 - B(A+1)]^{n+1}[V_{OUT}(0) - FT_p/(A+1)]. \qquad \text{(Eq. 4)}$$

Equation 4 may be analysed for stability in a fashion analogous to that used in s-plane analysis. The conditions for meeting the following two criteria will be derived:
1. Stability.
2. Non-oscillatory Response.

Stability is guaranteed if the following inquality is met:

$$|1 - B(A+1)| < 1. \qquad \text{(Eq. 5)}$$

This inequality translates into the following conditions on A for stability:

$$A > -1, \qquad \text{(Eq. 6a)}$$

and $$A < 1 + 2C_{CTRL}/C_R. \qquad \text{(Eq. 6b)}$$

No oscillations, whether damped or undamped, will occur if the following inequality is met:

$$1 - B(A+1) \geq 0. \quad \text{(Eq. 7)}$$

This inequality translates into the following condition on A for non-oscillatory behavior:

$$A \leq C_{CTRL}/C_R. \quad \text{(Eq. 8)}$$

Combining equations 6 and 8, the behavior of the loop as a function of gain "A" may be defined in four regions:

Region 1—Exponential growth: $A \leq -1$.
Region 2—Exponential decay: $-1 < A \leq C_{CTRL}/C_R$.
Region 3—Decaying oscillations: $C_{CTRL}/C_R < A < 1 + 2C_{CTRL}/C_R$.
Region 4—Growing oscillations: $1 + 2C_{CTRL}/C_R \leq A$.

Region 1 is, in practice, not possible to attain unless a logic-design error is made, and an extra inversion is accidentally included in the loop. Region 2 is the optimum region of operation, since the loop will be locked permanently to one operating point, and it will follow circuit disturbances in a stable manner. Region 3 will also be locked permanently to one operating point, but circuit disturbances will cause the loop to correct itself with some accompanying ringing. This type of operation, though undesirable, is acceptable. In Region 4, the loop will never lock onto one operating point but will oscillate between two points on either side of the correct operating point. Depending on the amplitude of the oscillations, the resulting jitter introduced in the timing signals may or may not be acceptable. In any case, operation in this region should be avoided.

The best operation is achieved when the delay line consists of a chain of identical voltage controlled delay (VCD) means. Thus, for example, if an SDL providing delays at Tp/2 and Tp/3 is needed, the delay line should consist of six VCD's with taps made at the second and third VCD. Where it is not practical to have an identical delay in each stage, the capacitance causing the delay should nevertheless be made identical in each stage, with the delay varied by changing the size of the transistors in the cross-coupled gates, charging and discharging the capacitors.

The value of the capacitors such as capacitor 59 is determined by simulating open-loop SDL delay under the following conditions: fast process file; low temperature; maximum specified Tp. The value is selected such that for a $V_{CTRL}$ equal to the supply voltage, the total delay exceeds Tp by an acceptable margin. The design should consider both low and high supply voltages.

The gain A may be measured directly from open-loop simulations. The value of $V_{OUT}$ is measured at the point it switches from low to high (this need not necessarily be the sampling point, but one close to it). $V_{CTRL}$ is then slightly changed, and the new value of $V_{OUT}$ at the same point is measured. A is, then, equal to $\Delta V_{OUT}/\Delta V_{CTRL}$. The $C_{CTRL}/C_R$ ratio should be made as large as possible to guarantee operation in Region 2 (see above) with a reasonable margin. The ratio $C_{CTRL}/C_R$ should, however, not be so large so as to slow down the SDL loop to the point it cannot respond quickly enough to circuit disturbances. The absolute values for $C_{CTRL}$ and $C_R$ should also be as large as is convenient while maintaining the required $C_{CTRL}/C_R$ ratio.

The SDL can enter a condition of latch-up which is stable (and fatal). In general, if $V_{CTRL}$, for whatever reason, becomes high enough to cause the overall delay to exceed Tp by approximately 50–100%, the SDL will enter a state of latch-up from which it will not recover. To prevent this condition, $C_{CTRL}$ should be discharged after power-up using the system reset signal coupled to transistor 109 of FIG. 4. This resetting causes $V_{CTRL}$ to search for its correct operating point starting from OV. This search path guarantees that no latch-up will occur. The time required for the SDL initially to settle after reset, however, must be taken into consideration in the system design.

Thus, a synchronized delay line has been described for generating a plurality of timing signals tapped along an SDL. The SDL produces delay intervals which are highly insensitive to variations in wafer processing, supply voltage and temperature.

I claim:

1. An integrated circuit delay line apparatus for generating at least a first delayed signal synchronized with a reference signal, comprising:
   a plurality of delay means, each for providing a controllable delay, each of said delay means coupled to receive a control signal for controlling the durations of said delays;
   the first of said delay means being coupled to receive said reference signal, each of the remaining said delay means being sequentially coupled to receive the delayed reference signal from said first delay means;
   control signal generation means for generating said control signal, said generation means coupled to receive said delayed reference signal from the last one of said sequentially coupled delay means; and,
   tap means for tapping a signal from said delay means to provide said first signal through use of said reference signal;
   whereby said first delayed signal is synchronized with and delayed from said reference signal.

2. The apparatus defined by claim 1 wherein said generation means comprises a sample-and-hold means, and a lowpass filter coupled to receive the output of said sample-and-hold means.

3. The apparatus defined by claim 2 including a plurality of gates, each gate being paired-with and coupled to one of said delay means, each of said gates coupled to sequentially receive said delayed reference signal.

4. The apparatus defined by claim 3 including circuit means between the source of said reference signal and said first delay means for causing said reference signal to have equal time durations in a low state and a high state.

5. The apparatus defined by claim 4 wherein said circuit means is a divide-by-two circuit.

6. The apparatus defined by claim 4 wherein each of said delay means provides a time delay which is equal.

7. An integrated circuit delay line apparatus for generating a timing signal synchronized with and delayed from a reference signal comprising:
   a plurality of delay line stages coupled to each other so as to sequentially delay said reference signal;
   said stages coupled to receive a common control signal, each stage for providing a delay controlled by said control signal;
   a sample-and-hold circuit coupled to sample said delayed reference signal from the last one of said stages, said sample-and-hold circuit being coupled to said reference signal;

a lowpass filter coupled to said sample-and-hold circuit for providing said control signal; and, tap means coupled to one of said stages for providing said timing signal through use of said reference signal;

whereby said timing signal provides a constant, synchronized delay with respect to said reference signal.

8. The apparatus defined by claim 7 including circuit means coupled between the source of said reference signal and the first ones of said stages for causing said reference signal to have equal time duration in a low state and in a high state.

9. The apparatus defined by claim 8 wherein said circuit means comprises a divide-by-two circuit.

10. The apparatus defined by claim 8 wherein said delay for each said stage is equal.

11. An integrated circuit delay line apparatus for generating a plurality of timing signals which are synchronized with a reference signal comprising:

a plurality of delay line stages coupled to each other so as to sequentially delay said reference signal, each of said stages including a pair of cross coupled gates, at least a first capacitor and at least a first transistor coupled to said first capacitor, said delay of said reference signal for each of said stages being a function of the capacitance of said first capacitor;

a common line for coupling a control signal to each of said first transistors so as to control the flow of current to said first capacitors;

a sample-and-hold circuit coupled to sample said delayed reference signal from the last of said stages, said sample-and-hold circuit being coupled to said reference signal; and a lowpass filter coupled to said sample-and-hold means for providing said control signal, the output of said filter being coupled to said common line;

whereby timing signals synchronized with said reference signal may be tapped from said stages through the use of said reference signal.

12. The apparatus defined by claim 11 wherein said delay of each stage is approximately equal.

13. The apparatus defined by claim 11 wherein each stage includes two of said first capacitors and two of said first transistors.

14. The apparatus defined by claim 11 wherein said sample-and-hold circuit is a switched capacitor network.

* * * * *